US009842897B2

United States Patent
Akarvardar et al.

(10) Patent No.: US 9,842,897 B2
(45) Date of Patent: Dec. 12, 2017

(54) BULK FINFET WITH PARTIAL DIELECTRIC ISOLATION FEATURING A PUNCH-THROUGH STOPPING LAYER UNDER THE OXIDE

(71) Applicant: GLOBALFOUNDRIES INC., Grand Cayman (KY)

(72) Inventors: Murat K. Akarvardar, Saratoga Springs, NY (US); Ajey P. Jacob, Albany, NY (US)

(73) Assignee: GLOBALFOUNDRIES INC., Grand Cayman (KY)

( * ) Notice: Subject to any disclaimer, the term of this patent is extended or adjusted under 35 U.S.C. 154(b) by 0 days.

(21) Appl. No.: 15/176,073

(22) Filed: Jun. 7, 2016

(65) Prior Publication Data

US 2016/0284802 A1 Sep. 29, 2016

Related U.S. Application Data

(62) Division of application No. 13/927,698, filed on Jun. 26, 2013, now Pat. No. 9,385,233.

(51) Int. Cl.
*H01L 29/10* (2006.01)
*H01L 29/78* (2006.01)
(Continued)

(52) U.S. Cl.
CPC .... *H01L 29/1083* (2013.01); *H01L 21/02236* (2013.01); *H01L 21/3065* (2013.01);
(Continued)

(58) Field of Classification Search
CPC ........... H01L 29/1083; H01L 29/66636; H01L 29/7848; H01L 29/785; H01L 27/0255;
(Continued)

(56) References Cited

U.S. PATENT DOCUMENTS 5,926,722 A 7/1999 Jang et al.
7,435,639 B2 * 10/2008 Winstead ................ H01L 21/84
257/E21.632
(Continued)

OTHER PUBLICATIONS

Office Action dated Oct. 20, 2014 in co-pending U.S. Appl. No. 13/927,698, now U.S. Pat. No. 9,385,233.
(Continued)

*Primary Examiner* — Tom Thomas
*Assistant Examiner* — Vincent Wall
(74) *Attorney, Agent, or Firm* — Williams Morgan, P.C.

(57) ABSTRACT

A bulk finFET with partial dielectric isolation is disclosed. The dielectric isolation is disposed underneath the channel, and essentially bounded by the channel, such that it does not extend laterally beyond the channel under the source and drain regions. This allows increased volume of SiGe source and drain stressor regions placed adjacent to the channel, allowing for a more strained channel, which improves carrier mobility. An N+ doped silicon region is disposed below the dielectric isolation and extends laterally beyond the channel and underneath the stressor source and drain regions, forming a reverse-biased p/n junction with the P+ doped source and drain SiGe stressor to minimize leakage currents from under the insulator.

7 Claims, 9 Drawing Sheets

(51) Int. Cl.
| | |
|---|---|
| H01L 29/06 | (2006.01) |
| H01L 27/02 | (2006.01) |
| H01L 21/02 | (2006.01) |
| H01L 29/165 | (2006.01) |
| H01L 29/66 | (2006.01) |
| H01L 21/3065 | (2006.01) |
| H01L 21/324 | (2006.01) |
| H01L 21/762 | (2006.01) |
| H01L 29/08 | (2006.01) |
| H01L 29/161 | (2006.01) |

(52) U.S. Cl.
CPC ...... *H01L 21/324* (2013.01); *H01L 21/76216* (2013.01); *H01L 21/76281* (2013.01); *H01L 27/0255* (2013.01); *H01L 29/0646* (2013.01); *H01L 29/0649* (2013.01); *H01L 29/0653* (2013.01); *H01L 29/0847* (2013.01); *H01L 29/1054* (2013.01); *H01L 29/161* (2013.01); *H01L 29/165* (2013.01); *H01L 29/66636* (2013.01); *H01L 29/66795* (2013.01); *H01L 29/785* (2013.01); *H01L 29/7848* (2013.01)

(58) Field of Classification Search
CPC ........... H01L 27/0262; H01L 29/66795; H01L 29/1037; H01L 29/0649; H01L 29/0653
See application file for complete search history.

(56) References Cited

U.S. PATENT DOCUMENTS

| | | | |
|---|---|---|---|
| 7,888,273 | B1 | 2/2011 | Wang et al. |
| 2006/0178003 | A1* | 8/2006 | Krishnaraj ........ H01L 21/02126 438/627 |
| 2007/0102756 | A1 | 5/2007 | Lojek |
| 2007/0102834 | A1 | 5/2007 | Enicks et al. |
| 2007/0249174 | A1 | 10/2007 | Yang |
| 2008/0142891 | A1 | 6/2008 | Booth et al. |
| 2009/0184369 | A1* | 7/2009 | Zhu .................. B82Y 10/00 257/347 |
| 2011/0140229 | A1* | 6/2011 | Rachmady ........ H01L 21/76224 257/506 |
| 2012/0168913 | A1* | 7/2012 | Toh .................. H01L 29/66795 257/618 |
| 2013/0026539 | A1 | 1/2013 | Tang |

OTHER PUBLICATIONS

Office Action dated Feb. 24, 2015 in co-pending U.S. Appl. No. 13/927,698, now U.S. Pat. No. 9,385,233.
Final Office Action dated Jul. 27, 2015 in co-pending U.S. Appl. No. 13/927,698, now U.S. Pat. No. 9,385,233.
Office Action dated Oct. 21, 2015 in co-pending U.S. Appl. No. 13/927,698, now U.S. Pat. No. 9,385,233.

* cited by examiner

BULK FINFET WITH PARTIAL DIELECTRIC ISOLATION FEATURING A PUNCH-THROUGH STOPPING LAYER UNDER THE OXIDE

CROSS-REFERENCE TO RELATED APPLICATIONS

This application is a Divisional of co-pending U.S. application Ser. No. 13/927,698 filed Jun. 26, 2013.

FIELD OF THE INVENTION

The present invention relates generally to semiconductor fabrication and, more particularly, to an improved finFET and method of fabrication.

BACKGROUND

FinFETs (Fin field-effect-transistors) are a technology which allows smaller and higher performance devices. Fin-FET structures comprise narrow isolated bars of silicon (fins) with a gate(s) on the top and the sides of the fin. With the continuing trend towards miniaturization of integrated circuits (ICs), there is a need for transistors having higher performance. Silicon-on-insulator (SOI) finFET devices have good electrical performance, but require more expensive substrates than the bulk wafers. Bulk finFETs, where there is no insulator film between the fins and the substrate, may have a lower manufacturing cost as compared with a SOI finFET. However, bulk finFETs can be more prone to leakage currents which can degrade the electrical performance and power consumption. It is therefore desirable to have improved finFET devices and methods of fabrication.

SUMMARY

A first aspect of the present invention provides a semiconductor structure comprising: a fin comprising a channel region; a gate dielectric region disposed on the fin; a gate region disposed on the gate dielectric region; an oxide region disposed under the fin underneath the channel region; an N+ doped silicon region disposed underneath the oxide region and extending laterally beyond the oxide region; and a first P+ doped SiGe source-drain region disposed adjacent to a first side of the channel region and adjacent to the oxide region, and a second P+ doped SiGe region disposed adjacent to a second side of the channel region and adjacent to the oxide region.

A second aspect of the present invention provides a method of forming a semiconductor structure, comprising: forming an N+ doped silicon layer on a semiconductor substrate; forming an undoped SiGe layer on the N+ doped silicon layer; forming a silicon channel layer on the undoped SiGe layer; performing a fin etch on the semiconductor structure to form a plurality of fins; depositing an oxide on the semiconductor structure and in between each of the plurality of fins; performing an anneal on the semiconductor structure to form a thermally formed oxide region; forming a gate on the semiconductor structure; performing an anisotropic etch into the semiconductor structure adjacent to the gate, and extending into the N+ doped silicon layer; and forming P+ doped SiGe regions adjacent to the gate and thermally formed oxide region, and extending into the N+ doped silicon layer.

A third aspect of the present invention provides a method of forming a semiconductor structure, comprising: forming an N+ doped silicon layer on a semiconductor substrate; forming an undoped SiGe layer on the N+ doped silicon layer; forming a silicon channel layer on the undoped SiGe layer; performing a fin etch on the semiconductor structure to form a plurality of fins; depositing an oxide on the semiconductor structure and in between each of the plurality of fins; performing an anneal on the semiconductor structure to form a thermally formed oxide region; forming a gate on the semiconductor structure; performing an anisotropic etch into the semiconductor structure adjacent to the gate, and extending into the N+ doped silicon layer; forming P+ doped SiGe regions adjacent to the gate and thermally formed oxide region, and extending into the N+ doped silicon layer, wherein forming an N+ doped silicon layer on a semiconductor substrate, forming an undoped SiGe layer on the N+ doped silicon layer, and forming a silicon channel layer on the undoped SiGe layer, are performed with an uninterrupted chemical vapor deposition process.

BRIEF DESCRIPTION OF THE DRAWINGS

Certain elements in some of the figures may be omitted, or illustrated not-to-scale, for illustrative clarity. The cross-sectional views may be in the form of "slices"; or "near-sighted" cross-sectional views, omitting certain background lines which would otherwise be visible in a "true" cross-sectional view, for illustrative clarity. Furthermore, for clarity, some reference numbers may be omitted in certain drawings.

Often, similar elements may be referred to by similar numbers in various figures (FIGs) of the drawing, in which case typically the last two significant digits may be the same, the most significant digit being the number of the drawing figure (FIG.).

Figure 1:
Figure 2:
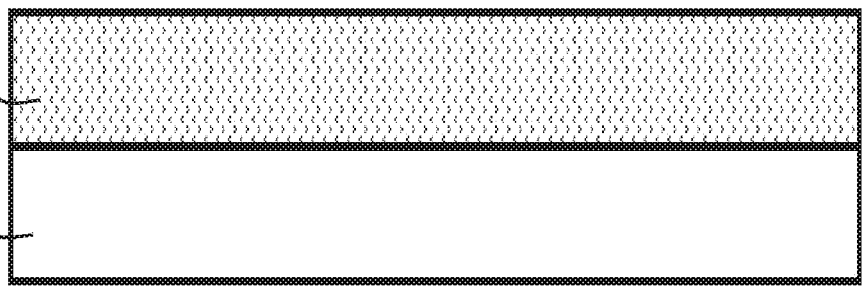
Figure 3:
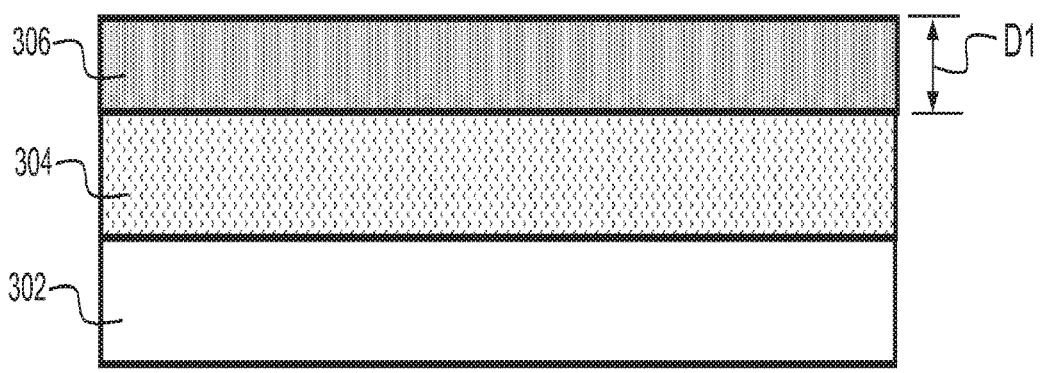
Figure 4:
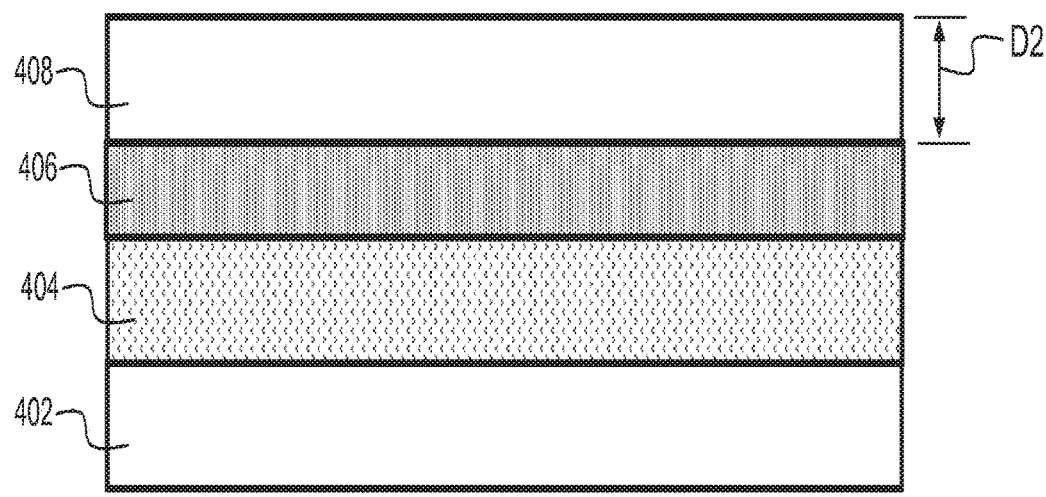
Figure 5:
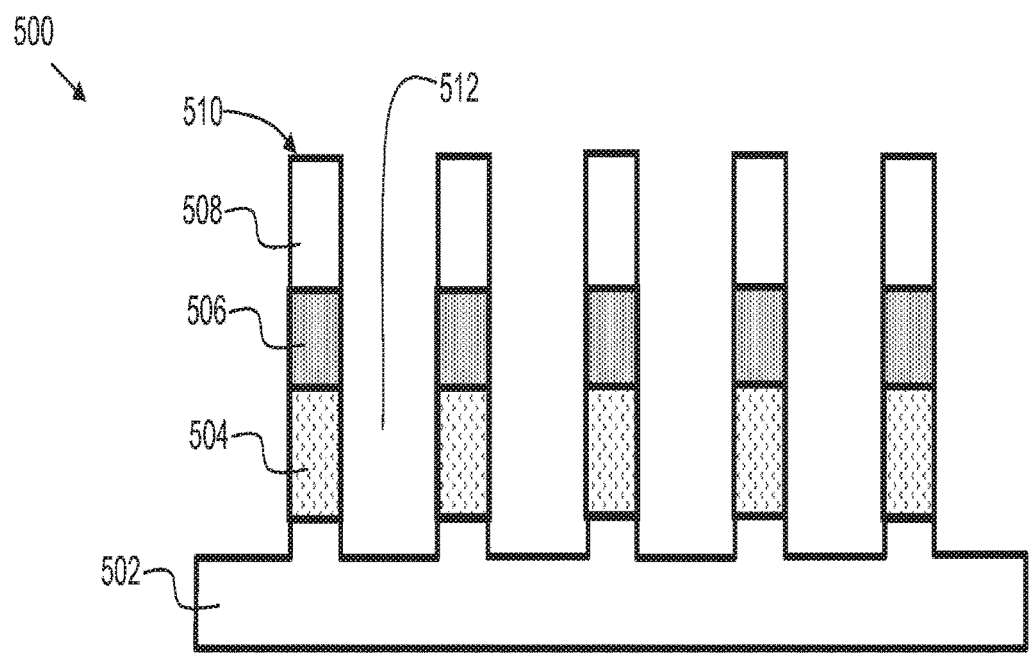
Figure 6:
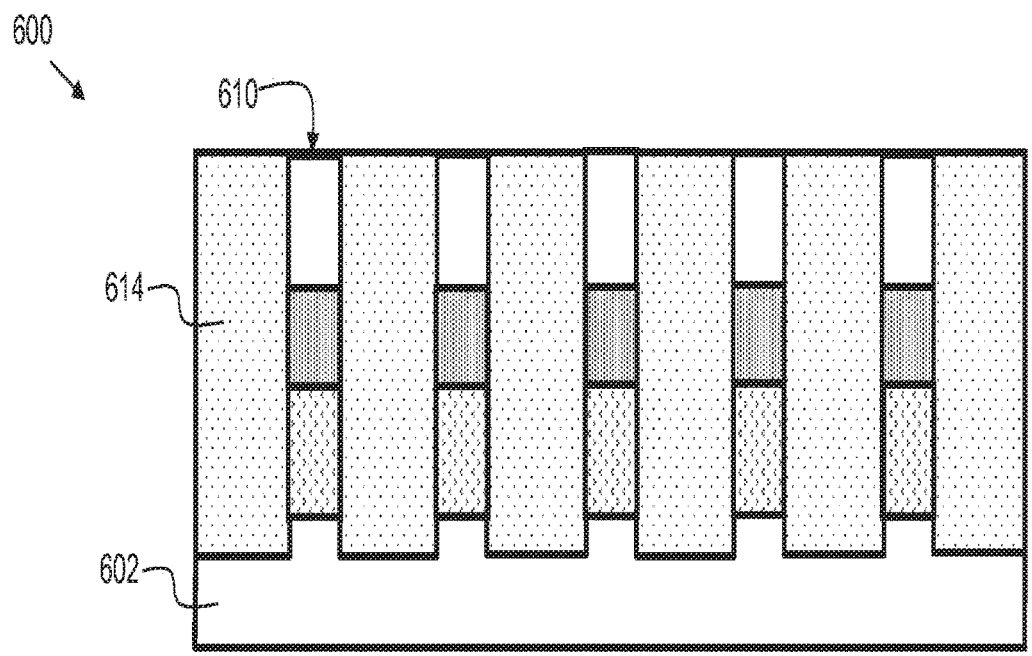
Figure 7A:
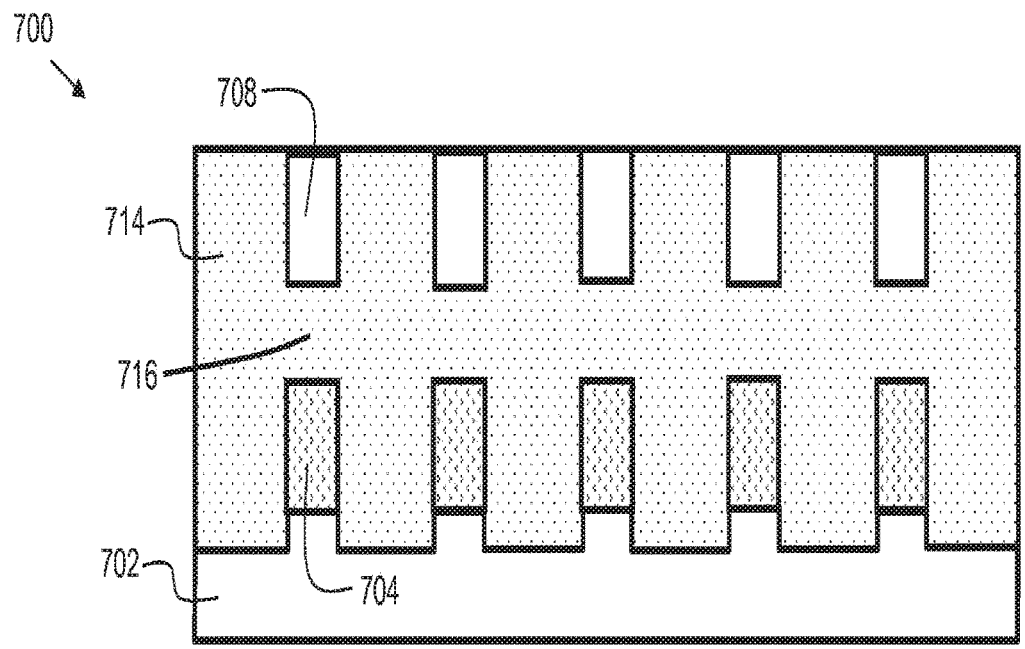
Figure 7B:
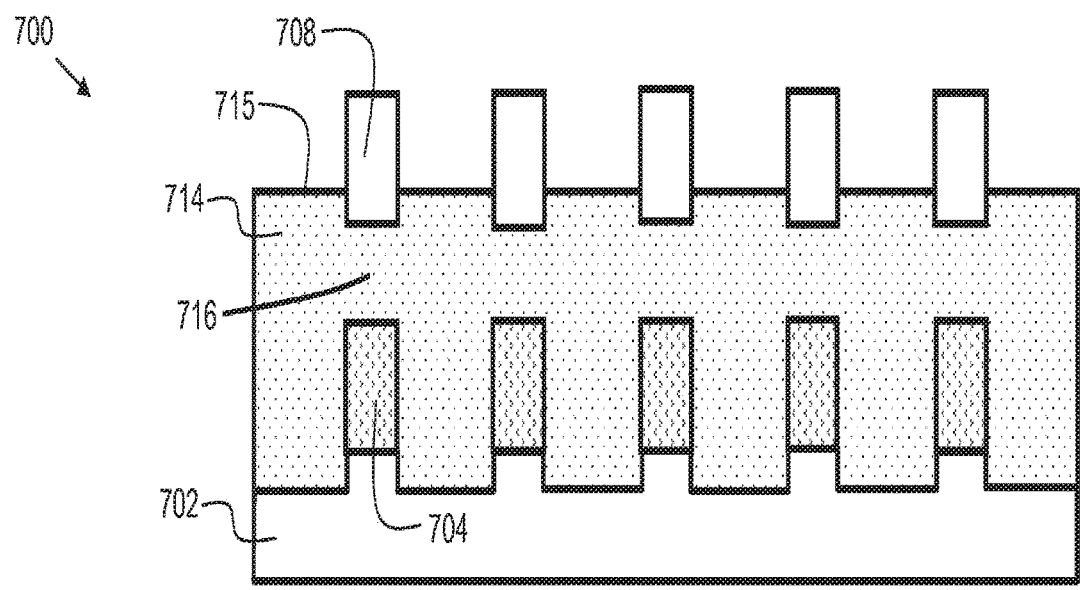
Figure 7C:
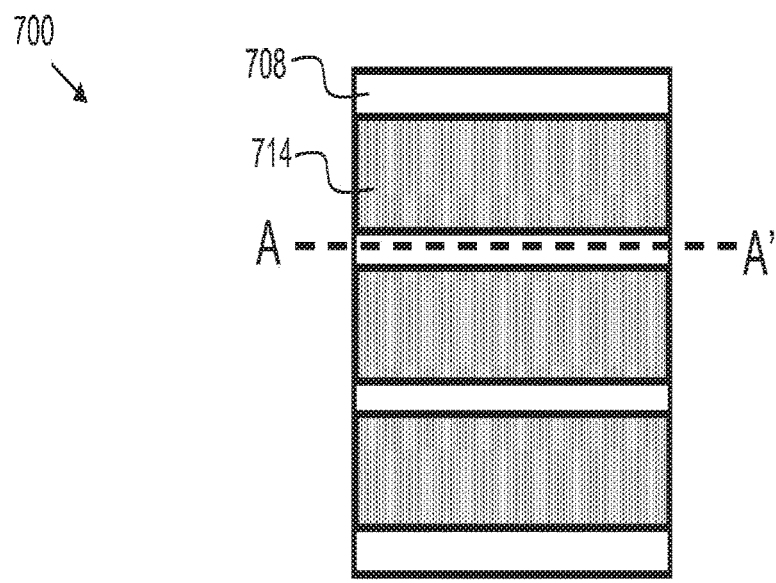
Figure 8:
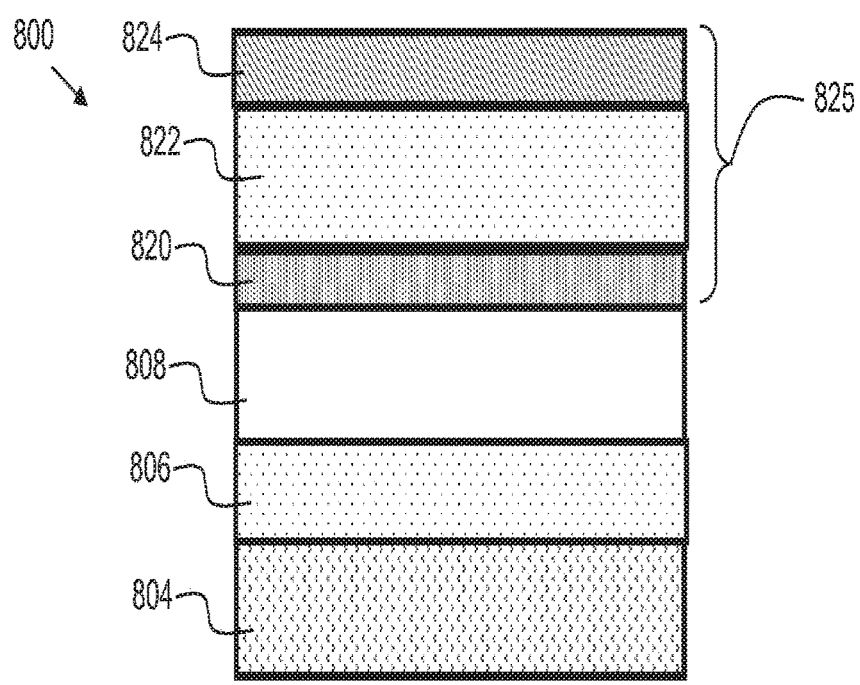
Figure 9:
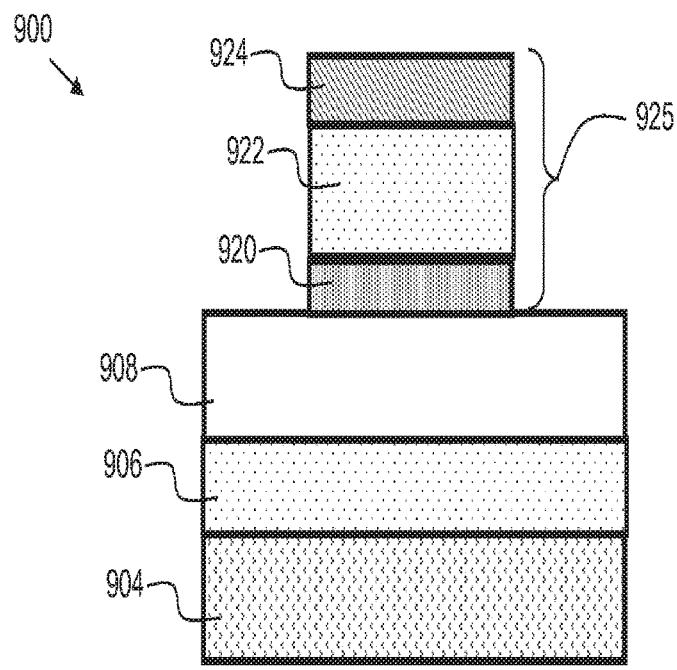
Figure 10:
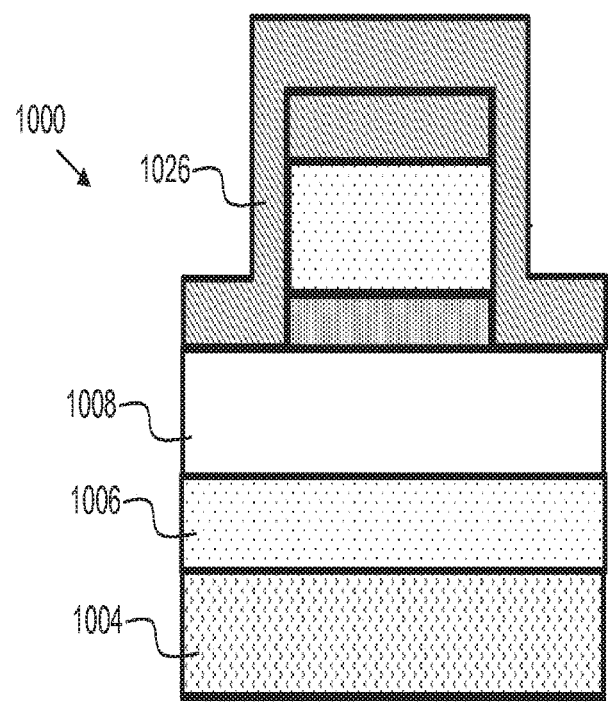
Figure 11:
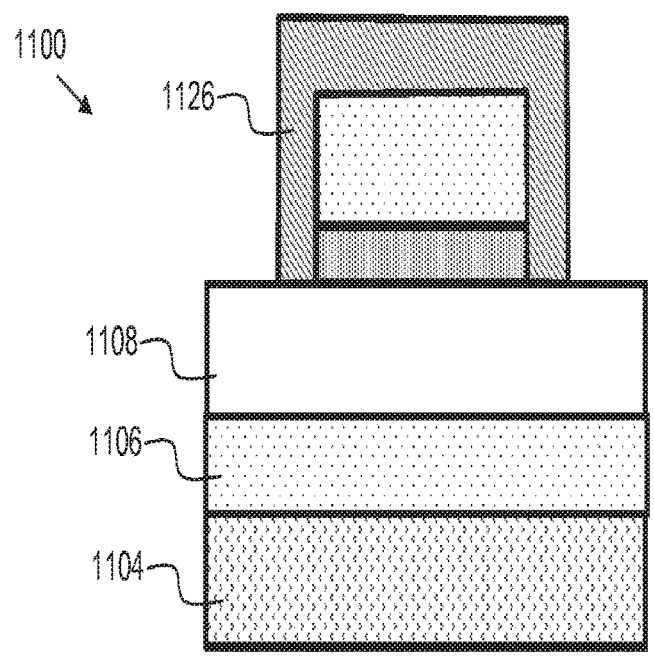
Figure 12:
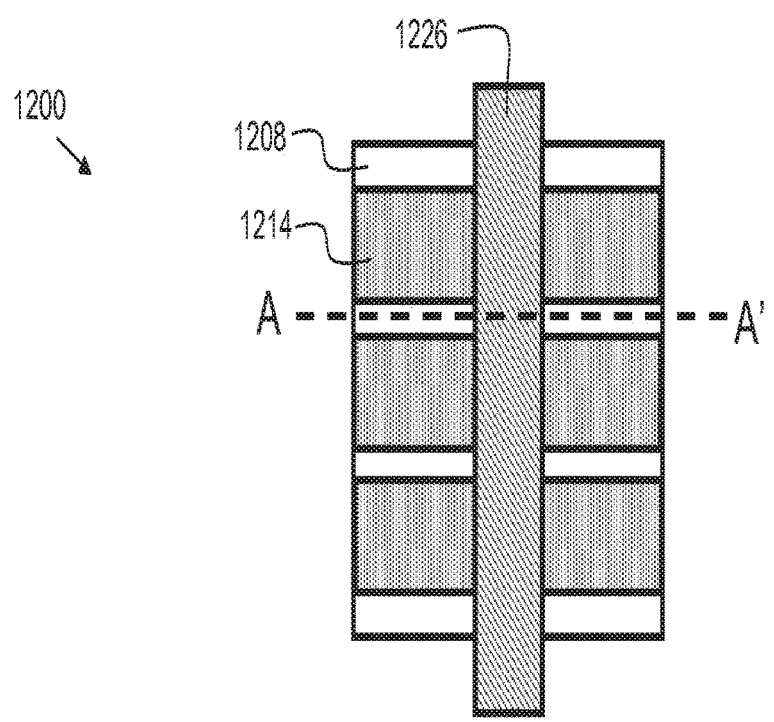
Figure 13:
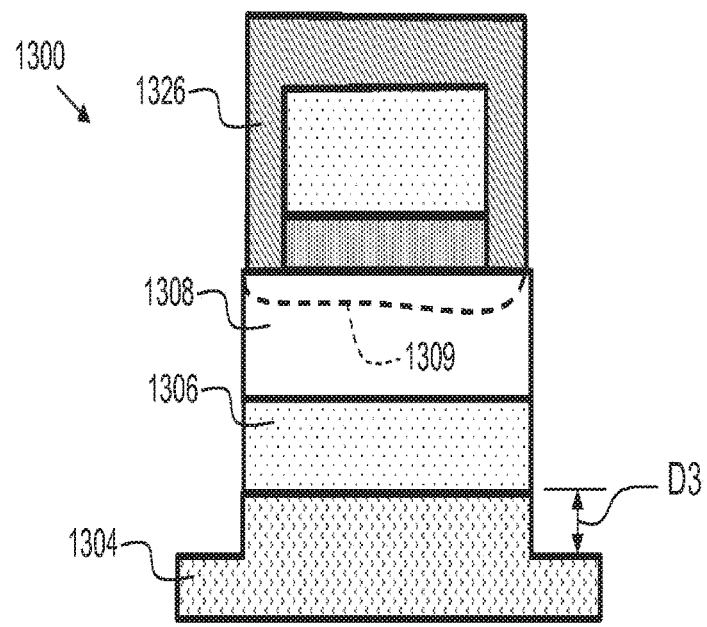
Figure 14:
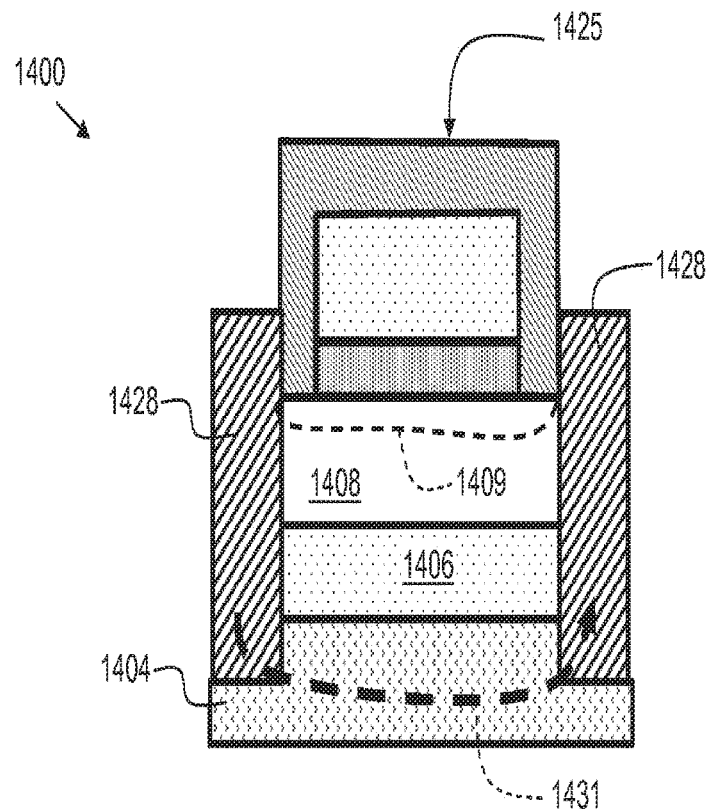
Figure 15:
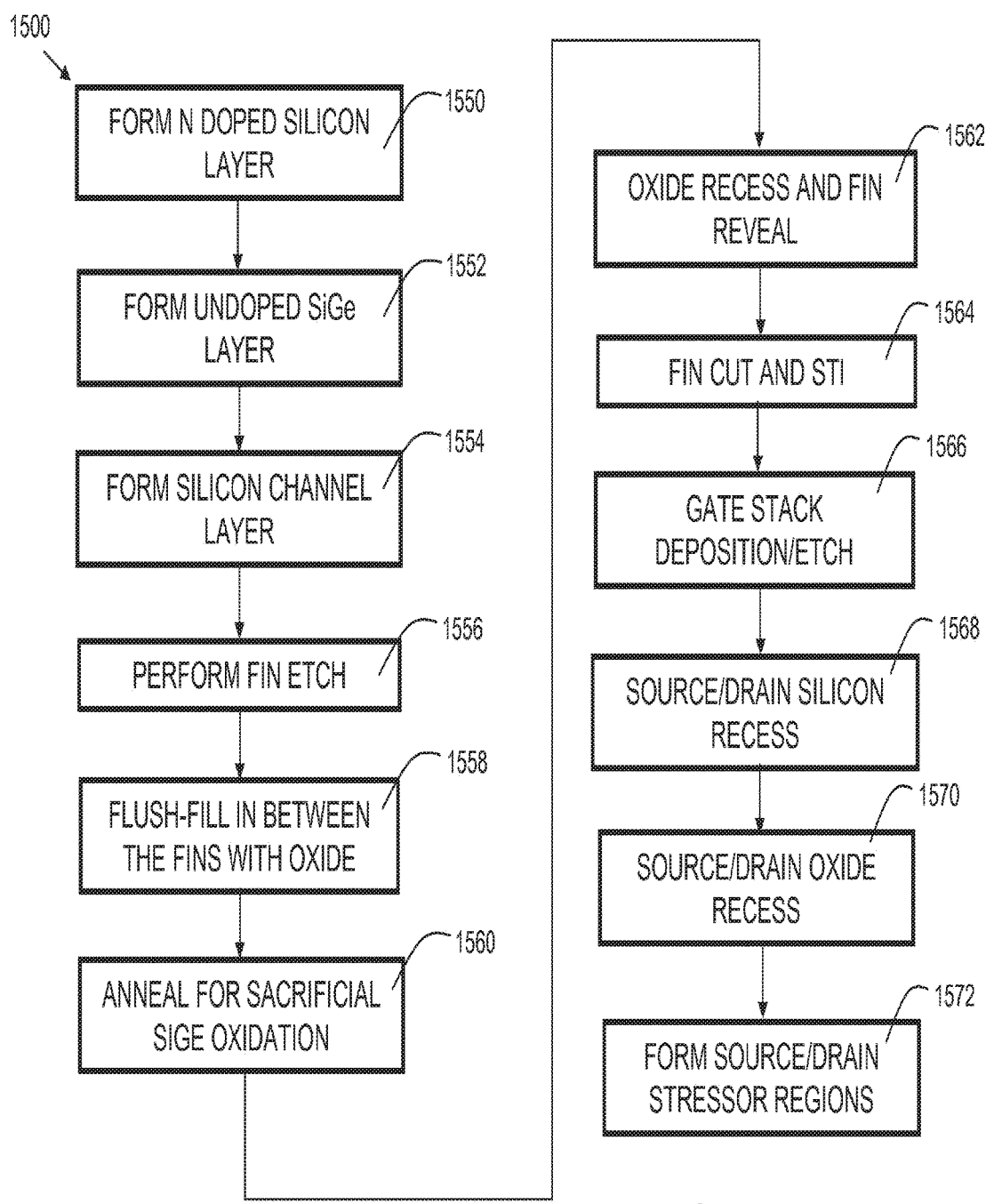

Features of this invention will be more readily understood from the following detailed description of the various aspects of the invention taken in conjunction with the accompanying drawings in which:

FIG. 1 is a semiconductor structure at a starting point for embodiments of the present invention;

FIG. 2 is a semiconductor structure after a subsequent process step of forming an N+ doped silicon region which will serve as a punch-through stopper layer, in accordance with illustrative embodiments;

FIG. 3 is a semiconductor structure after a subsequent process step of forming an undoped SiGe region, in accordance with illustrative embodiments;

FIG. 4 is a semiconductor structure after a subsequent process step of forming an undoped silicon region, in accordance with illustrative embodiments;

FIG. 5 is a semiconductor structure after a subsequent process step of forming a fin etch, in accordance with illustrative embodiments;

FIG. 6 is a semiconductor structure after a subsequent process step of depositing and planarizing an oxide layer, in accordance with illustrative embodiments;

FIG. 7A shows a semiconductor structure after a subsequent process step of an anneal, in accordance with illustrative embodiments;

FIG. 7B, and FIG. 7C show a semiconductor structure after a subsequent process step of a recess, in accordance with illustrative embodiments;

FIG. 8 is a semiconductor structure after a subsequent process step of depositing a gate layer stack, in accordance with illustrative embodiments;

FIG. 9 is a semiconductor structure after a subsequent process step of etching the gate layer stack, in accordance with illustrative embodiments;

FIG. 10 is a semiconductor structure after a subsequent process step of depositing a spacer layer, in accordance with illustrative embodiments;

FIG. 11 is a semiconductor structure after a subsequent process step of performing a spacer etch, in accordance with illustrative embodiments;

FIG. 12 is a top down view of a semiconductor structure in accordance with illustrative embodiments;

FIG. 13 is a semiconductor structure after a subsequent process step of performing a substrate recess, in accordance with illustrative embodiments;

FIG. 14 is a semiconductor structure after a subsequent process step of forming P+ doped SiGe regions, in accordance with illustrative embodiments; and FIG. 15 is a flowchart indicating process steps for embodiments of the present invention.

DETAILED DESCRIPTION

Exemplary embodiments will now be described more fully herein with reference to the accompanying drawings, in which exemplary embodiments are shown. Embodiments of the present invention provide a bulk finFET with partial dielectric isolation. The dielectric isolation is disposed underneath the channel, and essentially bounded by the channel, such that it does not extend laterally beyond the channel under the source and drain regions. This allows increased volume of SiGe source and drain stressor regions placed adjacent to the channel, allowing for a more strained channel, which improves carrier mobility. An N+ doped silicon region is disposed below the dielectric isolation and extends laterally beyond the channel and underneath the stressor source and drain regions, forming a reverse-biased pin junction with the P+ doped source and drain SiGe stressor to minimize leakage currents from under the insulator, thus providing a finFET with improved performance. The N+ doped silicon region is important, as without it, if the underlying substrate is left undoped, punch-through from under the gate occurs for small gate lengths (20 nm or below) and transistor operation is compromised due to excessive leakage.

It will be appreciated that this disclosure may be embodied in many different forms and should not be construed as limited to the exemplary embodiments set forth herein. Rather, these exemplary embodiments are provided so that this disclosure will be thorough and complete and will fully convey the scope of this disclosure to those skilled in the art. The terminology used herein is for the purpose of describing particular embodiments only and is not intended to be limiting of this disclosure. For example, as used herein, the singular forms "a", "an", and "the" are intended to include the plural forms as well, unless the context clearly indicates otherwise. Furthermore, the use of the terms "a", "an", etc., do not denote a limitation of quantity, but rather denote the presence of at least one of the referenced items. It will be further understood that the terms "comprises" and/or "comprising", or "includes" and/or "including", when used in this specification, specify the presence of stated features, regions, integers, steps, operations, elements, and/or components, but do not preclude the presence or addition of one or more other features, regions, integers, steps, operations, elements, components, and/or groups thereof.

Reference throughout this specification to "one embodiment," "an embodiment," "embodiments," "exemplary embodiments," or similar language means that a particular feature, structure, or characteristic described in connection with the embodiment is included in at least one embodiment of the present invention. Thus, appearances of the phrases "in one embodiment," "in an embodiment," "in embodiments" and similar language throughout this specification may, but do not necessarily, all refer to the same embodiment.

The terms "overlying" or "atop", "positioned on" or "positioned atop", "underlying", "beneath" or "below" mean that a first element, such as a first structure (e.g., a first layer), is present on a second element, such as a second structure (e.g. a second layer), wherein intervening elements, such as an interface structure (e.g. interface layer), may be present between the first element and the second element.

FIG. 1 is a semiconductor structure 100 at a starting point for embodiments of the present invention indicating semiconductor substrate 102. Semiconductor substrate 102 may be comprised of silicon, and may be in the form of a bulk silicon wafer.

FIG. 2 is a semiconductor structure 200 after a subsequent process step of forming an N+ doped silicon region, in accordance with illustrative embodiments. As stated previously, similar elements may be referred to by similar numbers in various figures (FIGs) of the drawing, in which case typically the last two significant digits may be the same. For example, substrate 202 of FIG. 2 is similar to substrate 102 of FIG. 1. Semiconductor structure 200 further includes N+ doped semiconductor region 204. In embodiments, N+ doped semiconductor region 204 may be formed by growing an in-situ doped epitaxial layer. Phosphorus dopants may be used. Alternatively, the N+ doped semiconductor region 204 may be formed by ion implantation followed by an anneal. Arsenic or phosphorus dopants may be used. In some embodiments, the dopant concentration may range from about 5E18 atoms per cubic centimeter to about 5E19 atoms per cubic centimeter.

FIG. 3 is a semiconductor structure 300 after a subsequent process step of forming an undoped silicon germanium (SiGe) epitaxial region 306, in accordance with illustrative embodiments. In some embodiments, the germanium concentration in SiGe epitaxial region 306 may range from about 30 percent to about 70 percent. In particular embodiments, the germanium concentration in SiGe epitaxial region 306 may range from about 45 percent to about 50 percent. In some embodiments, the germanium concentration in SiGe epitaxial region 306 may be about 50 percent. In some embodiments, the depth D1 of SiGe epitaxial region 306 may range from about 20 nanometers to about 30 nanometers.

FIG. 4 is a semiconductor structure 400 after a subsequent process step of forming an epitaxial undoped silicon region 408, in accordance with illustrative embodiments. Region 408 serves as a silicon channel layer. In some embodiments, the depth D2 epitaxial undoped silicon region 408 may range from about 5 nanometers to about 50 nanometers. In some embodiments, the process steps illustrated in FIGS. 2-4 may be performed with an uninterrupted chemical vapor deposition (CVD) process. That is, the regions 404, 406, and 408 may be formed in the same chamber without breaking the vacuum, by adjusting the different precursor gases flowing into the chamber. In some embodiments, the CVD process may include a rapid thermal chemical vapor deposition (RTCVD) process.

FIG. 5 is a semiconductor structure 500 after a subsequent process step of forming a fin etch, in accordance with illustrative embodiments. As a result of the fin etch process, a plurality of fins 510 are formed, having a gap 512 disposed between the fins 510. Each fin comprises a stack including N+ doped semiconductor region 504, SiGe epitaxial region 506, and silicon channel layer 508. The fin formation process may include a sidewall image transfer (SIT) process, or other suitable technique for forming semiconductor fins.

FIG. 6 is a semiconductor structure 600 after a subsequent process step of depositing an oxide layer 614, in accordance with illustrative embodiments. The oxide layer 614 is deposited on the semiconductor structure and in between the fins. The oxide layer 614 may be a HARP (high aspect ratio process) oxide, or a flowable oxide. The oxide layer 614 preferably has good gap fill properties such that it fills gap 512 (FIG. 5) with minimal voids. After depositing oxide layer 614, a planarization process, such as a chemical mechanical polish (CMP) process, may be used to make the top of the oxide layer 614 flush with the top of fins 610.

FIG. 7A is a cross section view of semiconductor structure 700 after a subsequent process step of performing an anneal, in accordance with illustrative embodiments. As a result of the anneal, the SiGe epitaxial region 506 (FIG. 5) is oxidized, resulting in oxide region 716 disposed underneath the silicon channel layer 708. Hence, the small oxide region 716 is a thermally formed oxide, whereas the large oxide region 714 is formed by a deposition process. In embodiments, the small oxide region 716 may comprise SiO2 or GeO2. In other embodiments, the small oxide region 716 may comprise germanium nanocrystals or some form of germanium dispersed in SiO2. The SiGe epitaxial region oxidizes much quicker than the silicon channel layer 708, resulting in a selective oxidation process. In embodiments, the anneal may be performed at a temperature ranging from about 500 degrees Celsius to about 600 degrees Celsius in a steam environment. In embodiments, the anneal may be performed for a time duration ranging from about 120 minutes to about 360 minutes. Depending on the concentration of the SiGe epitaxial region 506 (FIG. 5), and the anneal time and temperature, some germanium may diffuse into N+ doped semiconductor region 704, such that N+ doped semiconductor region 704 now comprises germanium.

FIG. 7B is a cross section view of semiconductor structure 700 after a subsequent process step of performing an oxide recess, in accordance with illustrative embodiments. The top surface 715 of oxide layer 714 is recessed such that the fin channels are revealed. In embodiments, the top surface 715 may be recessed to the bottom of the fins 708. In a subsequent process step, a gate stack is formed on the fins 708, as is illustrated in upcoming figures.

FIG. 7C is a top-down view of semiconductor structure 700. The flush oxide filling in between the fins serves as a mechanical anchor during the anneal such that the oxidation-induced stress does not lead to the tilting or deformation of the active Si channel layer (fins) 708.

FIG. 8 is a semiconductor structure 800 after a subsequent process step of depositing a gate layer stack, in accordance with illustrative embodiments. FIG. 8 shows a structure along the fins, as indicated by line A-A' of FIG. 7B. Structure 800 comprises a stack including N+ doped semiconductor region 804, silicon-oxide region 806 containing dispersed germanium, and silicon channel layer 808. A gate stack 825 is formed on semiconductor structure 800. Gate stack 825 includes gate dielectric layer 820, gate material 822, and nitride hard-mask layer 824. The gate dielectric layer 820 and gate material 822 may be dummy materials, for use in a RMG (replacement metal gate) process flow.

FIG. 9 is a semiconductor structure 900 after a subsequent process step of etching the gate layer stack, in accordance with illustrative embodiments. Gate stack 925 may be patterned using an anisotropic etch process and industry-standard patterning techniques.

FIG. 10 is a semiconductor structure 1000 after a subsequent process step of depositing a spacer layer 1026, which may include a second nitride layer, in accordance with illustrative embodiments.

FIG. 11 is a semiconductor structure 1100 after a subsequent process step of performing a spacer etch, in accordance with illustrative embodiments, forming a sidewall gate spacer 1126.

FIG. 12 is a top down view of a semiconductor structure 1200 in accordance with illustrative embodiments, indicating the gate spacer 1226 oriented orthogonally to the fins 1208.

FIG. 13 is a semiconductor structure 1300 after a subsequent process step of performing a substrate recess, in accordance with illustrative embodiments. The substrate recess is performed with an anisotropic etch process. In embodiments, the anisotropic etch process comprises a reactive ion etch (RIE) process. The substrate recess extends partially into N+ doped semiconductor region 1304, to a depth of D3. In some embodiments, depth D3 may range from about 10 nanometers to about 20 nanometers. Disposed above the N+ doped semiconductor region 1304 is oxide region 1306. Disposed above oxide region 1306 is silicon channel layer 1308. Silicon channel layer 1308 includes channel region 1309 where carriers flow from source to drain under certain conditions.

FIG. 14 is a semiconductor structure after a subsequent process step of forming P+ doped SiGe regions, in accordance with illustrative embodiments. P+ doped SiGe source and drain regions 1428 are formed adjacent to the channel layer 1408, and extending into the N+ doped silicon layer 1404. In embodiments, the P+ doped SiGe regions 1428 may have a germanium concentration ranging from about 25 percent to about 100 percent. In embodiments, the P+ doped SiGe regions 1428 may comprise boron dopants. The oxide region 1406 is primarily disposed only under the channel region 1409. Hence, semiconductor structure 1400 may be referred to as a partial dielectric isolation bulk finFET structure. The advantages of this structure are that the partial dielectric isolation allows a greater volume for the P+ doped SiGe regions 1428. The increased volume allows for increased stress to the channel which can increase carrier mobility, which can increase the performance of the finFET device. Furthermore, the N+ doped silicon layer 1404 and P+ doped SiGe regions 1428 form a reverse-biased pin junction to minimize leakage from under the oxide region 1406, essentially preventing the leakage path indicated by arrow 1431. Thus, embodiments of the present invention can provide the advantages of increased stressor layer volume (P+ doped SiGe regions 1428 serves as a stressor layer), while minimize leakage from under the oxide region 1406 by establishing a reverse-biased pin junction. From this point forward, industry-standard processing may be used to complete the fabrication process. This may include replacing the gate 1425 with another gate made of different materials.

While the embodiment illustrated in FIG. 14 applies to a PFET, embodiments of the present invention may also be applied to an NFET. In the case of an NFET, region 1404 is a P− region, and regions 1428 may be comprised of N+ doped SiC (silicon-carbon).

FIG. 15 is a flowchart 1500 indicating process steps for embodiments of the present invention. In process step 1550, an N+ doped silicon layer is formed (see 204 of FIG. 2). In process step 1552, an undoped SiGe layer is formed (see 306 of FIG. 3). In process step 1554, a silicon channel layer is formed (see 408 of FIG. 4). In process step 1556, a fin etch is performed (see 500 of FIG. 5). In process step 1558, an oxide is deposited and planarized to fill in between the fins, and be flush with the fins (see 614 of FIG. 6). In process step 1560, an anneal is performed, selectively oxidizing the SiGe to form an oxide region disposed underneath the silicon channel layer (see 716 of FIG. 7). Process steps 1562-1570 include additional steps that may be necessary in some embodiments. In process step 1562 the oxide is recessed to reveal the fins. In process step 1564, the fins are cut (as required by the design), and shallow trench isolation regions are formed. In process step 1566 the gate stack is deposited and etched, and a gate is formed (see 1425 of FIG. 14). In process step 1568, the silicon is recessed adjacent to the gate to provide space for stressor regions. In process step 1570, the oxide is recessed to provide space for the stressor regions. In process step 1572, source and drain stressor regions are formed (see 1428 of FIG. 14).

While the invention has been particularly shown and described in conjunction with exemplary embodiments, it will be appreciated that variations and modifications will occur to those skilled in the art. For example, although the illustrative embodiments are described herein as a series of acts or events, it will be appreciated that the present invention is not limited by the illustrated ordering of such acts or events unless specifically stated. Some acts may occur in different orders and/or concurrently with other acts or events apart from those illustrated and/or described herein, in accordance with the invention. In addition, not all illustrated steps may be required to implement a methodology in accordance with the present invention. Furthermore, the methods according to the present invention may be implemented in association with the formation and/or processing of structures illustrated and described herein as well as in association with other structures not illustrated. Therefore, it is to be understood that the appended claims are intended to cover all such modifications and changes that fall within the true spirit of the invention.

What is claimed is:

1. A semiconductor structure comprising:
a fin comprising a channel region;
a gate dielectric region disposed on the fin;
a gate region disposed on the gate dielectric region;
an oxide region disposed underneath the channel region;
an N+ doped silicon region disposed underneath the oxide region and extending laterally beyond the oxide region; and
a first P+ doped SiGe source-drain region disposed adjacent to a first side of the channel region and adjacent to the oxide region, and a second P+ doped SiGe region disposed adjacent to a second side of the channel region and adjacent to the oxide region wherein the first P+ doped SiGe region and the second P+ doped SiGe region have a germanium concentration ranging from about 25 percent to about 100 percent, and the first P+ doped SiGe region and the second P+ doped SiGe region extend partially into and contact the N+ doped silicon region.

2. The semiconductor structure of claim 1, wherein the N+ doped silicon region has a dopant concentration ranging from about 5E18 atoms per cubic centimeter to about 5E19 atoms per cubic centimeter.

3. The semiconductor structure of claim 2, wherein the N+ doped silicon region comprises arsenic dopants.

4. The semiconductor structure of claim 2, wherein the N+ doped silicon region comprises phosphorus dopants.

5. The semiconductor structure of claim 1, wherein the first P+ doped SiGe regions and the second P+ doped SiGe region comprise boron dopants.

6. The semiconductor structure of claim 1, wherein the N+ doped silicon region disposed underneath the oxide region further comprises germanium.

7. The semiconductor structure of claim 1, wherein the oxide region comprises germanium dispersed in silicon oxide.

* * * * *